(12) United States Patent
Chen

(10) Patent No.: US 10,790,246 B1
(45) Date of Patent: Sep. 29, 2020

(54) METHOD OF TRANSFERRING DIFFERENT TYPES OF MICRO DEVICES

(71) Applicant: MIKRO MESA TECHNOLOGY CO., LTD., Apia (WS)

(72) Inventor: Li-Yi Chen, Tainan (TW)

(73) Assignee: MIKRO MESA TECHNOLOGY CO., LTD., Apia (WS)

( * ) Notice: Subject to any disclaimer, the term of this patent is extended or adjusted under 35 U.S.C. 154(b) by 0 days.

(21) Appl. No.: 16/507,057

(22) Filed: Jul. 10, 2019

(51) Int. Cl.
*H01L 23/00* (2006.01)
*H01L 27/32* (2006.01)

(52) U.S. Cl.
CPC ............. *H01L 24/03* (2013.01); *H01L 24/06* (2013.01); *H01L 24/72* (2013.01); *H01L 24/75* (2013.01); *H01L 27/3218* (2013.01); *H01L 2224/83948* (2013.01)

(58) Field of Classification Search
None
See application file for complete search history.

(56) References Cited

U.S. PATENT DOCUMENTS

| | | | | |
|---|---|---|---|---|
| 2014/0267683 | A1* | 9/2014 | Bibl | G09G 3/006 348/87 |
| 2016/0141196 | A1* | 5/2016 | Chang | H01L 24/75 414/751.1 |
| 2017/0278760 | A1* | 9/2017 | Chen | H01L 22/22 |
| 2019/0280152 | A1* | 9/2019 | Kristal | H01L 51/5056 |
| 2019/0393198 | A1* | 12/2019 | Takeya | H01L 25/0753 |

OTHER PUBLICATIONS

Corning, A., "Tackling MicroLED Production and Quality Challenges", Radiat Vision Systems, Mar. 2, 2020 downloaded from URL <https://www.radiantvisionsystems.com/blog/tackling-microled-production-quality-challenges> on Jun. 2, 2020. (Year: 2020).*

Xiaojie Zhou, Pengfei Tian, Chin-Wei Sher, Jiang Wu, Hezhuang Liu, Ran Liu, Hao-Chung Kuo, Growth, transfer printing and colour conversion techniques towards full-colour micro-LED display,Progress in Quantum Electronics, vol. 71, 2020, p. 100263. doi 10.1016/j.pquantelec.2020.100263. (Year: 2020).*

Virey, E. et al., "Overlooked Challenges for microLED Displays", SID 2019 Digest p. 129-133, 11-3, DOI:org/10.1002/sdtp.12872 (Year: 2019).*

Ding, K. et al., "Micro-LEDs, a Manufacturability Perspective", Applied Sciences, 2019, DOI:10.3390/app9061206 (Year: 2019).*

\* cited by examiner

*Primary Examiner* — J. E. Schoenholtz
(74) *Attorney, Agent, or Firm* — CKC & Partners Co., LLC

(57) ABSTRACT

A method of transferring different types of micro devices is provided. The method includes: assembling a first detachable transfer plate with first type micro devices thereon to an alignment assistive mechanism which is substantially above a receiving substrate, wherein the first type micro devices face the receiving substrate; aligning the first type micro devices on the first detachable transfer plate with positions of first sub-pixels respectively of pixels on the receiving substrate by the alignment assistive mechanism; transferring the first type micro devices to the first sub-pixels on the receiving substrate; replacing the first detachable transfer plate with a second detachable transfer plate with second type micro devices thereon, wherein the second type micro devices face the receiving substrate; and transferring the second type micro devices to second sub-pixels respectively of the pixels on the receiving substrate.

19 Claims, 17 Drawing Sheets

METHOD OF TRANSFERRING DIFFERENT TYPES OF MICRO DEVICES

BACKGROUND

Field of Invention

The present disclosure relates to a method of transferring different types of micro devices.

Description of Related Art

The statements in this section merely provide background information related to the present disclosure and do not necessarily constitute prior art.

Traditional technologies for transferring of devices include transferring from a transfer wafer to a receiving substrate by wafer bonding. One such implementation is "direct bonding" involving one bonding stage of an array of devices from a transfer wafer to a receiving substrate, followed by removal of the transfer wafer. Another such implementation is "indirect bonding" which involves two bonding/de-bonding stages. In indirect bonding, a transfer head may pick up an array of devices from a donor substrate, and then bond the array of devices to a receiving substrate, followed by removal of the transfer head.

In recent years, many researchers and experts try to overcome difficulties in making a massive transfer of devices (i.e., transferring millions or tens of millions of devices) possible for commercial applications. Among those difficulties, cost reduction, time efficiency, and yield are three of the important issues.

SUMMARY

According to some embodiments of the present disclosure, a method of transferring different types of micro devices is provided. The method includes: assembling a first detachable transfer plate with first type micro devices thereon to an alignment assistive mechanism which is substantially above a receiving substrate, in which the first type micro devices face the receiving substrate; aligning the first type micro devices on the first detachable transfer plate with positions of first sub-pixels respectively of pixels on the receiving substrate by the alignment assistive mechanism; transferring the first type micro devices to the first sub-pixels on the receiving substrate; replacing the first detachable transfer plate with a second detachable transfer plate with second type micro devices thereon, wherein the second type micro devices face the receiving substrate; and transferring the second type micro devices to second sub-pixels respectively of the pixels on the receiving substrate.

It is to be understood that both the foregoing general description and the following detailed description are by examples, and are intended to provide further explanation of the disclosure as claimed.

BRIEF DESCRIPTION OF THE DRAWINGS

The disclosure can be more fully understood by reading the following detailed description of the embodiment, with reference made to the accompanying drawings as follows.

DETAILED DESCRIPTION

Figure 1:
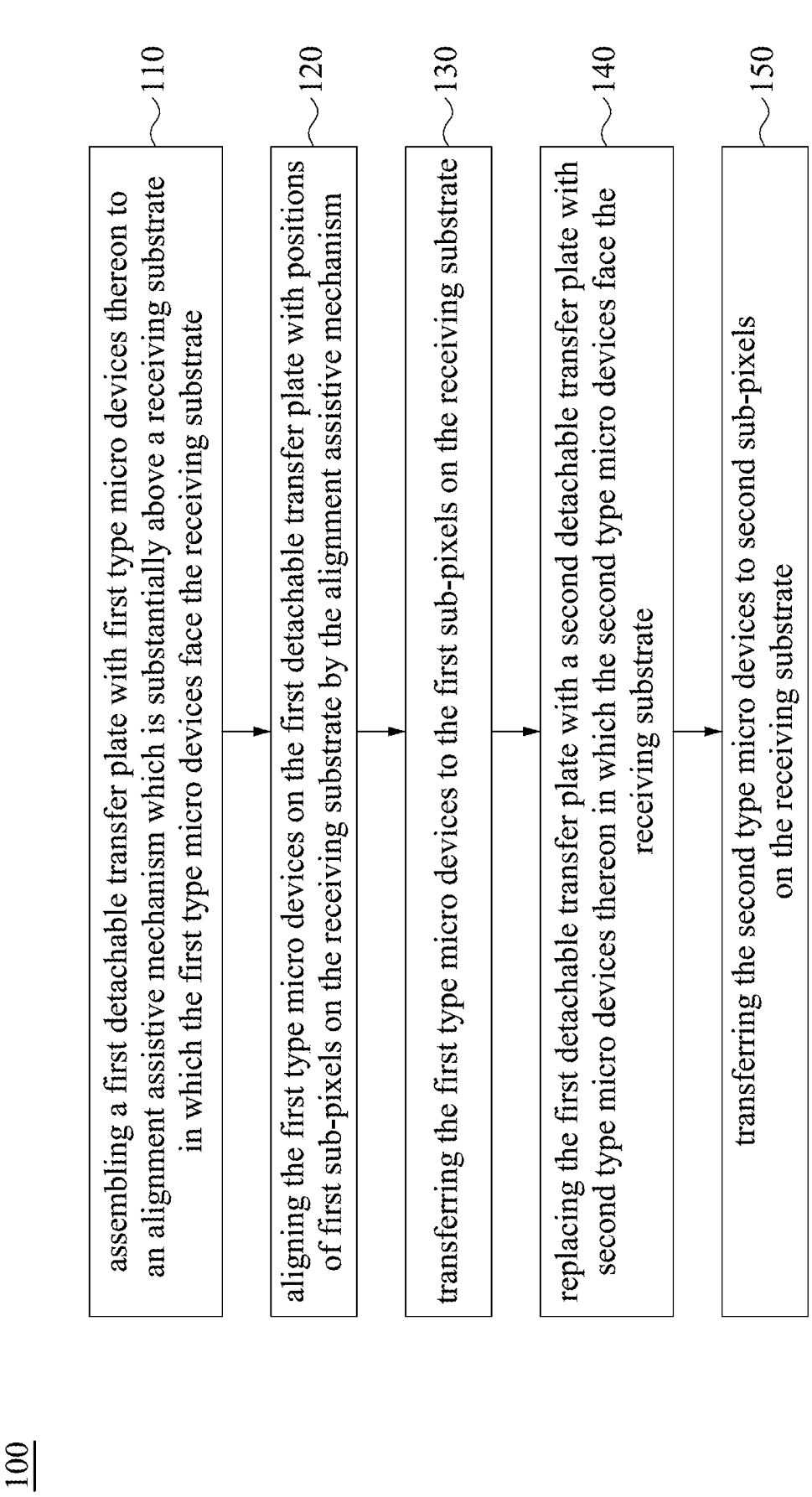
FIG. 1 is a schematic flow chart of a method of transferring different types of micro devices according to some embodiments of the present disclosure.

Reference will now be made in detail to the present embodiments of the disclosure, examples of which are illustrated in the accompanying drawings. Wherever possible, the same reference numbers are used in the drawings and the description to refer to the same or like parts.

In various embodiments, the description is made with reference to figures. However, certain embodiments may be practiced without one or more of these specific details, or in combination with other known methods and configurations. In the following description, numerous specific details are set forth, such as specific configurations, dimensions, and processes, etc., in order to provide a thorough understanding of the present disclosure. In other instances, well-known semiconductor processes and manufacturing techniques have not been described in particular detail in order to not unnecessarily obscure the present disclosure. Reference throughout this specification to "one embodiment," "an embodiment" or the like means that a particular feature, structure, configuration, or characteristic described in connection with the embodiment is included in at least one embodiment of the disclosure. Thus, the appearances of the phrase "in one embodiment," "in an embodiment" or the like in various places throughout this specification are not necessarily referring to the same embodiment of the disclosure. Furthermore, the particular features, structures, configurations, or characteristics may be combined in any suitable manner in one or more embodiments.

The terms "over," "to," "between" and "on" as used herein may refer to a relative position of one layer with respect to other layers. One layer "over" or "on" another layer or bonded "to" another layer may be directly in contact with the other layer or may have one or more intervening layers. One layer "between" layers may be directly in contact with the layers or may have one or more intervening layers.

Figure 2A:
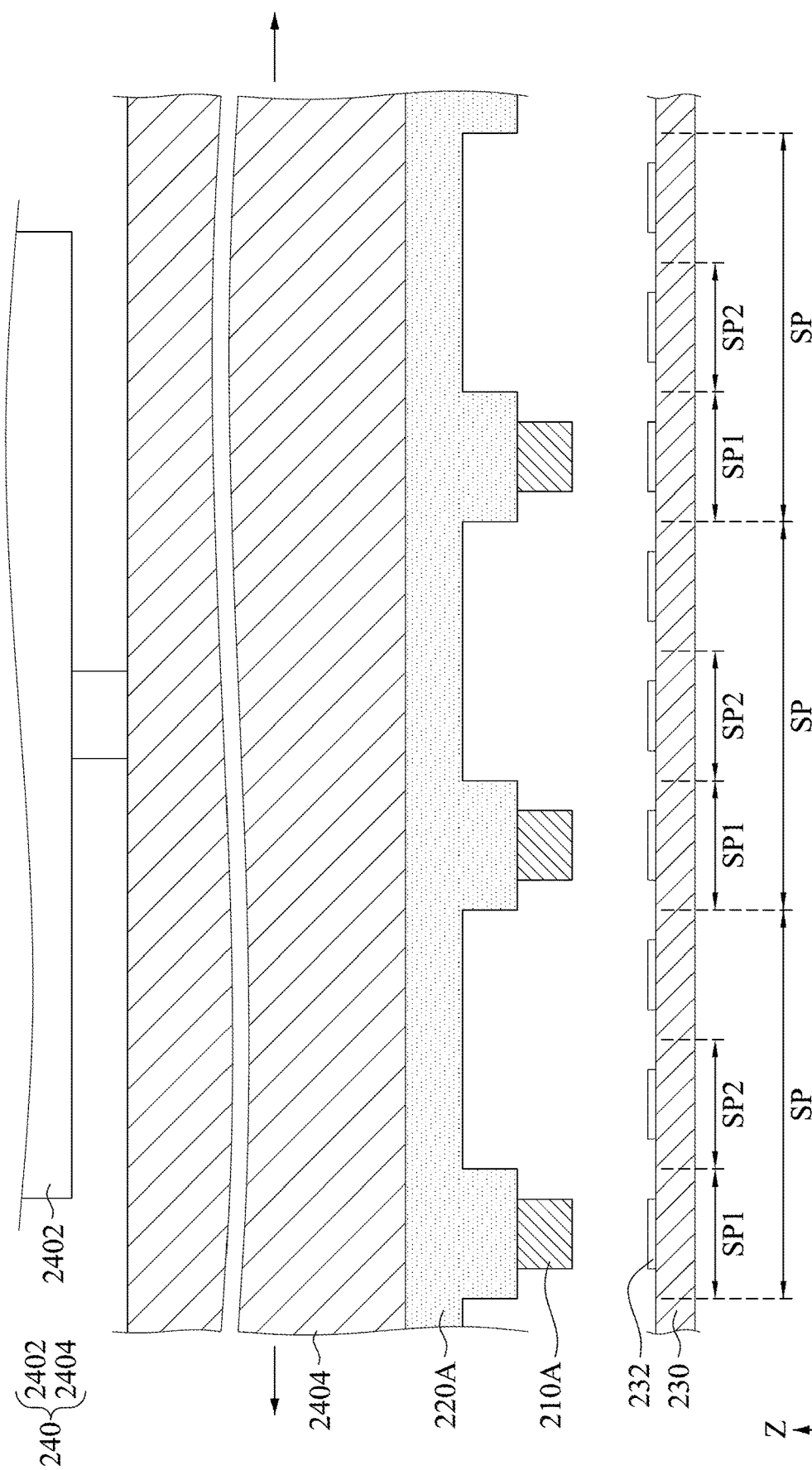
FIG. 2A is a schematic cross-sectional view of an intermediate stage of the method of transferring different types of micro devices according to some embodiments of the present disclosure.
Figure 2B:
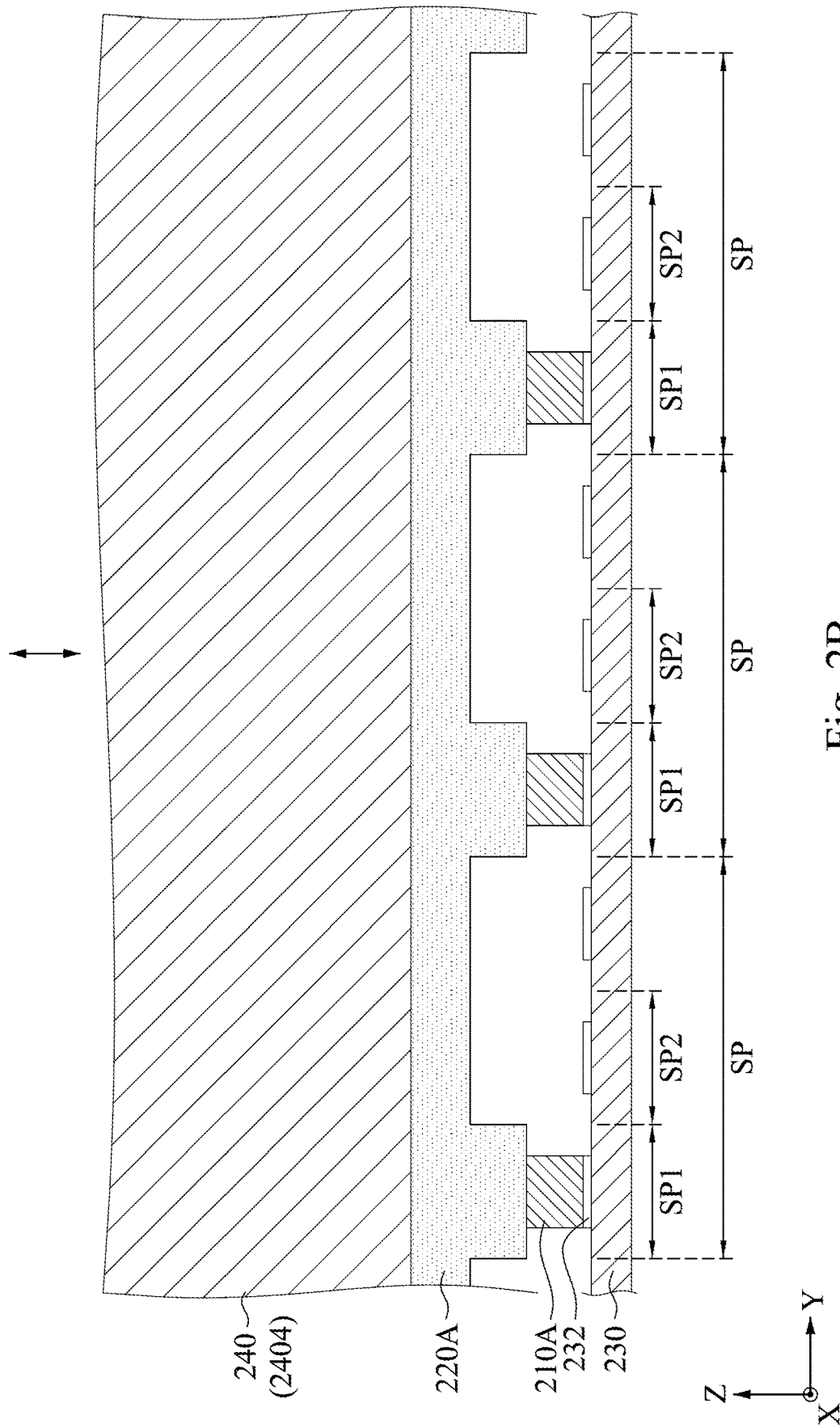
FIG. 2B is a schematic cross-sectional view of an intermediate stage of the method of transferring different types of micro devices according to some embodiments of the present disclosure.
Figure 2C:
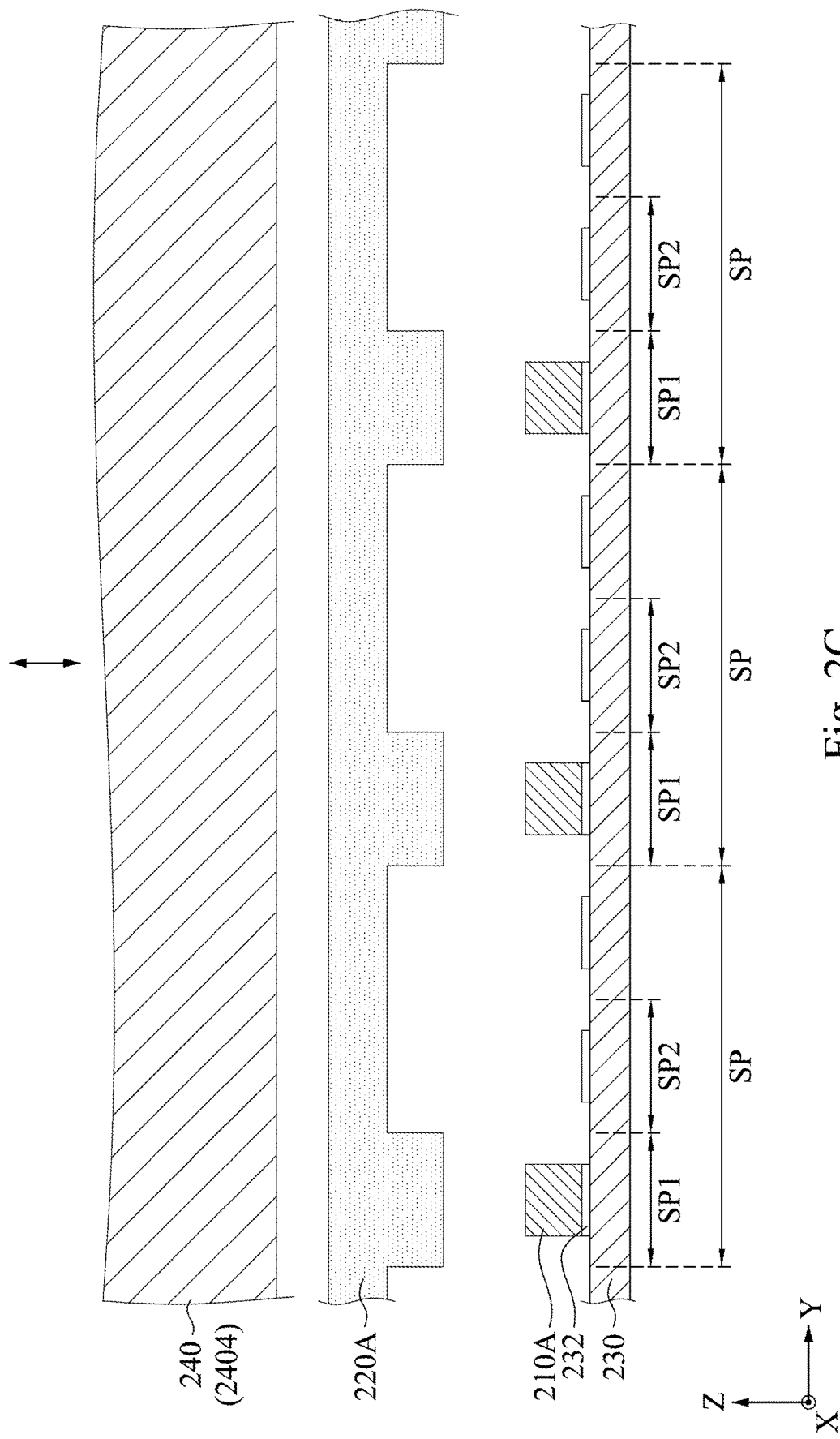
FIG. 2C is a schematic cross-sectional view of an intermediate stage of the method of transferring different types of micro devices according to some embodiments of the present disclosure.
Figure 2D:
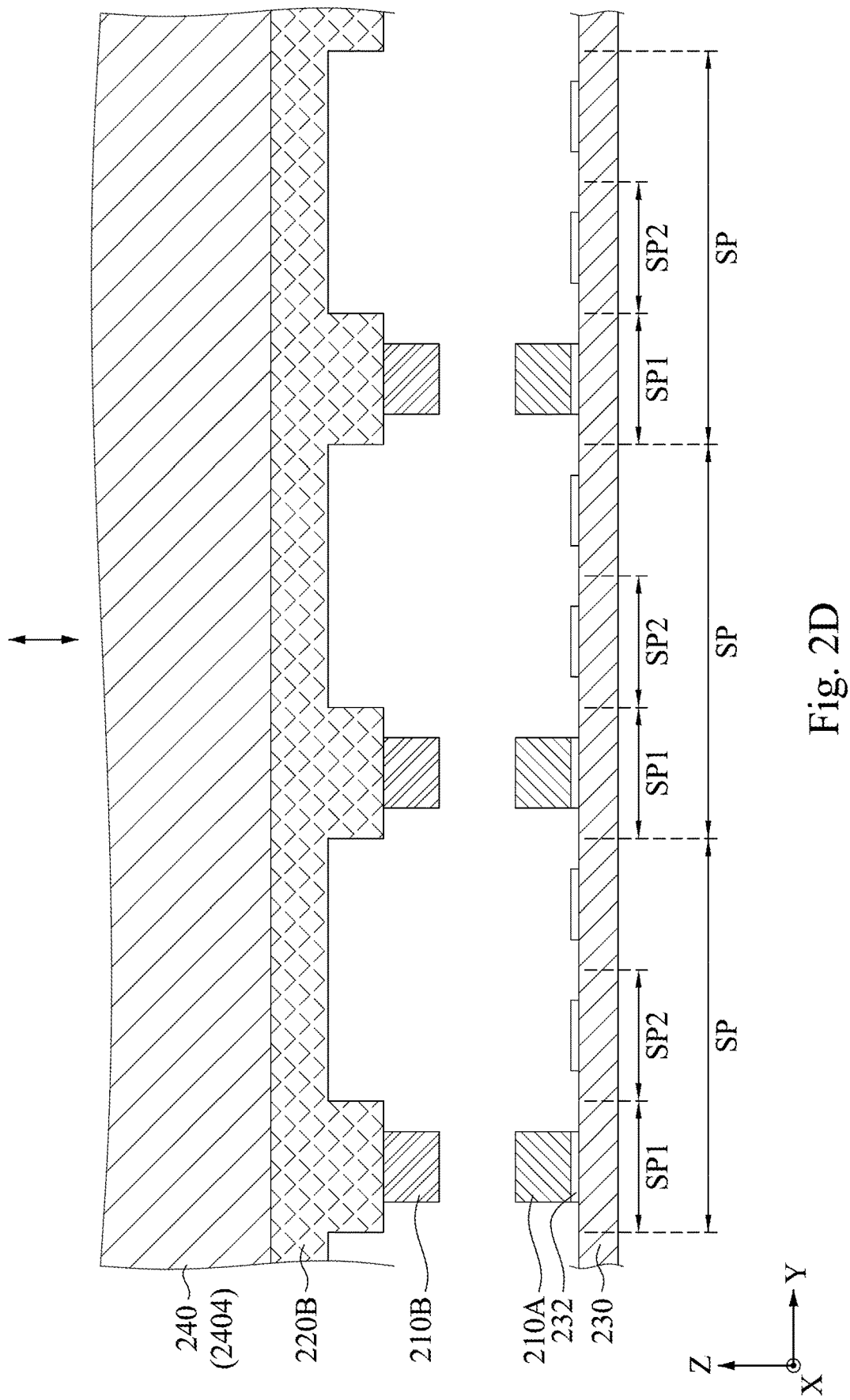
FIG. 2D is a schematic cross-sectional view of an intermediate stage of the method of transferring different types of micro devices according to some embodiments of the present disclosure.
Figure 2E:
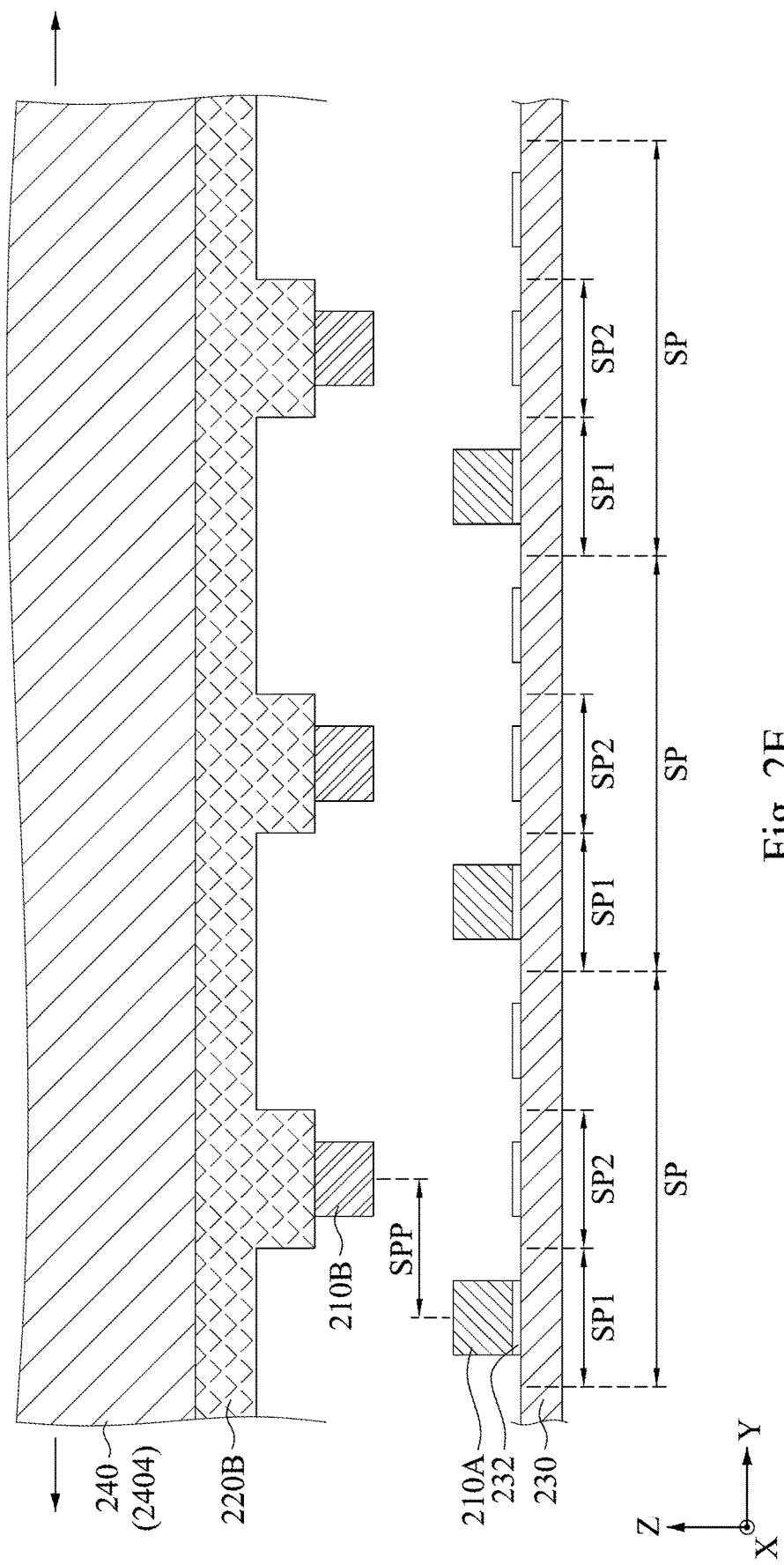
FIG. 2E is a schematic cross-sectional view of an intermediate stage of the method of transferring different types of micro devices according to some embodiments of the present disclosure.
Figure 2E:
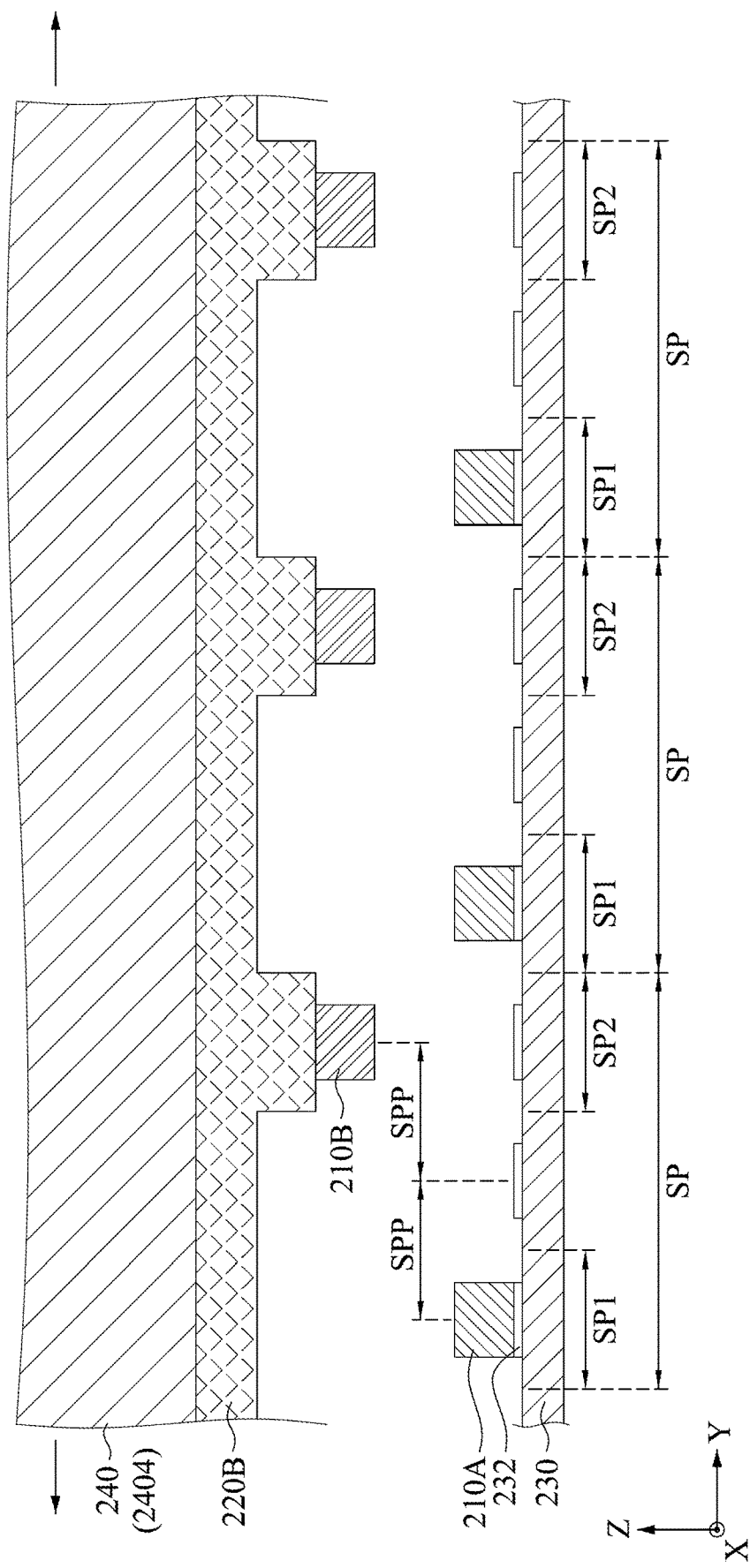
Figure 2F:
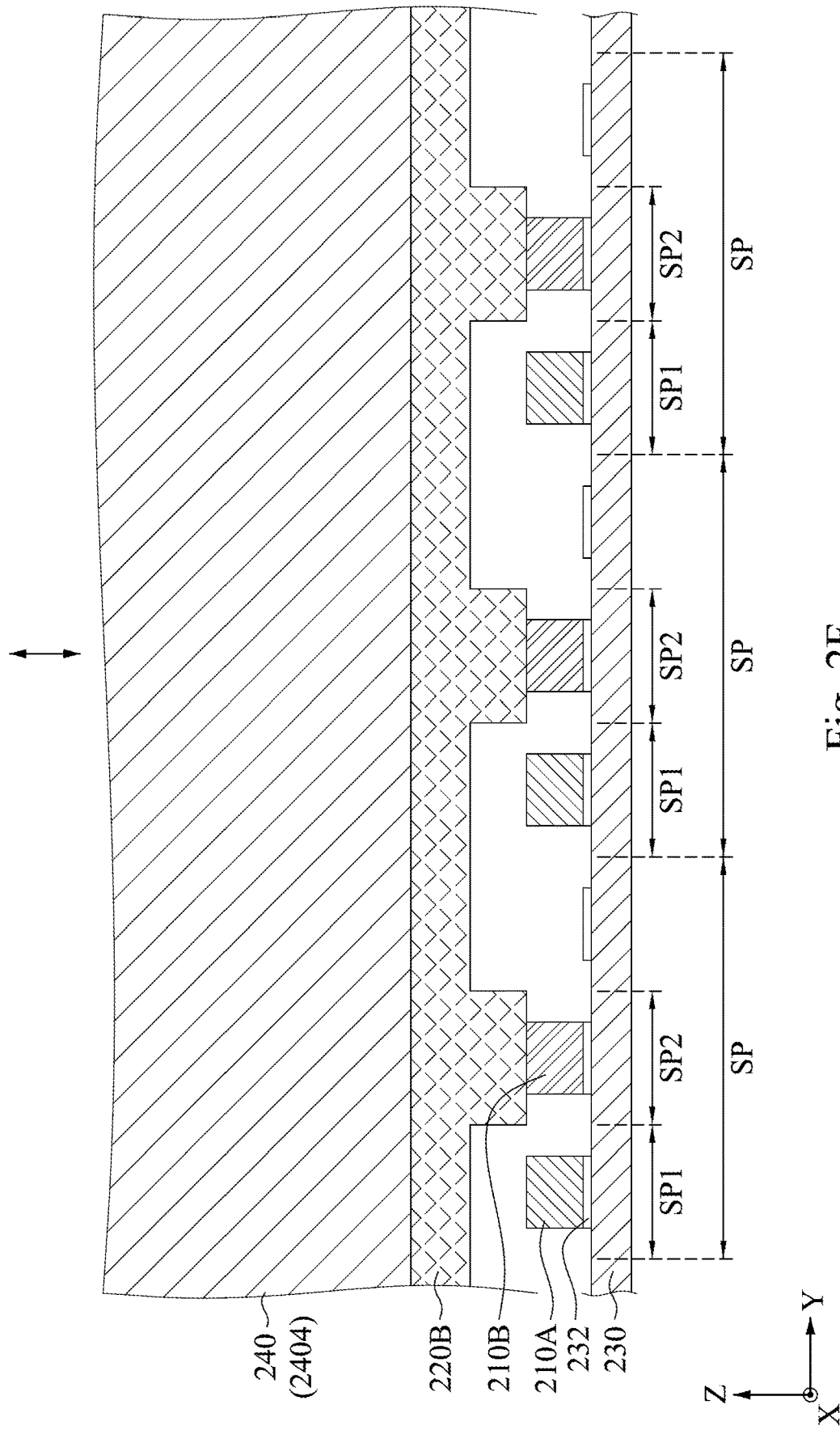
FIG. 2F is a schematic cross-sectional view of an intermediate stage of the method of transferring different types of micro devices according to some embodiments of the present disclosure.
Figure 2F:
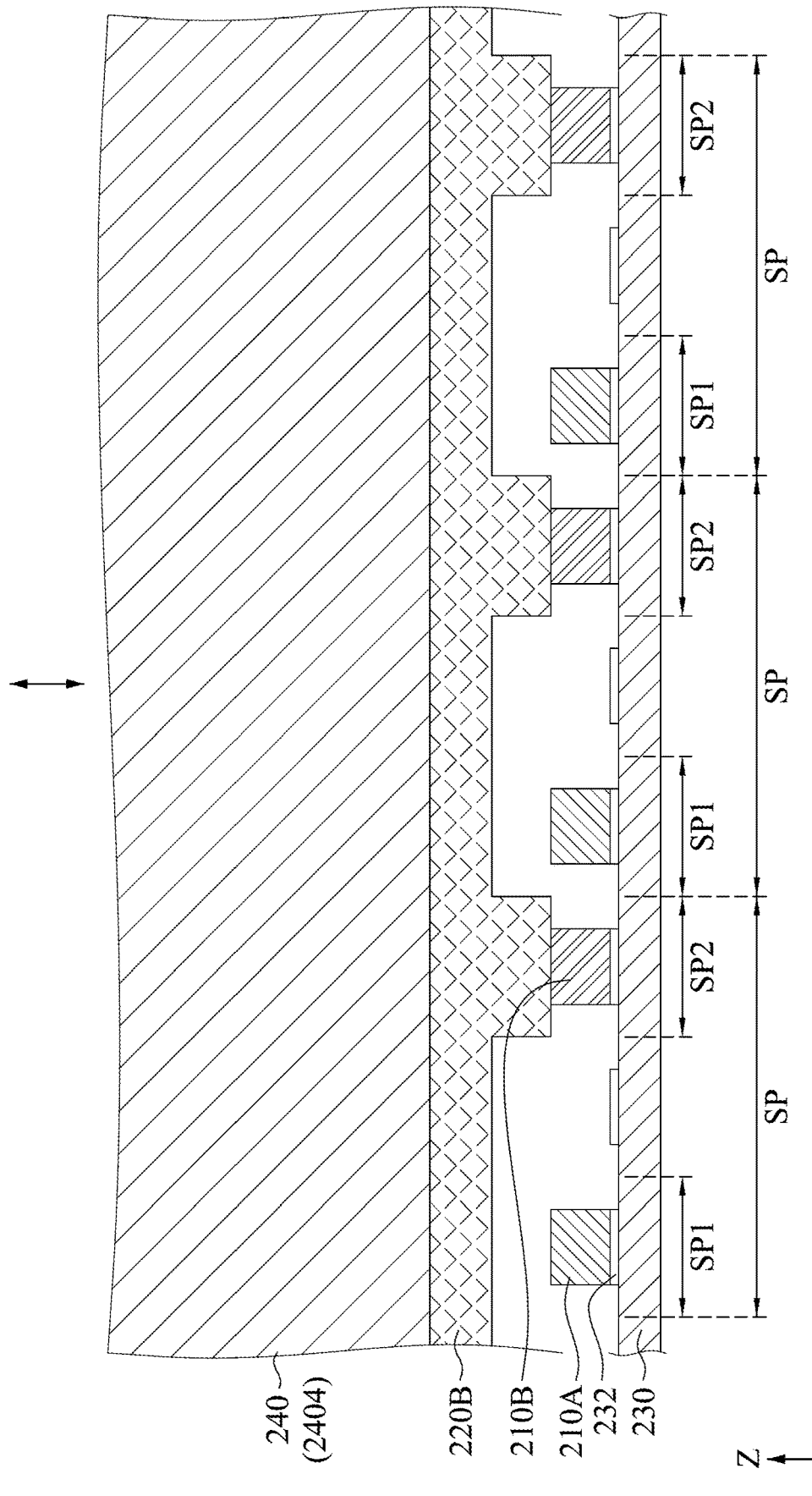
Figure 2G:
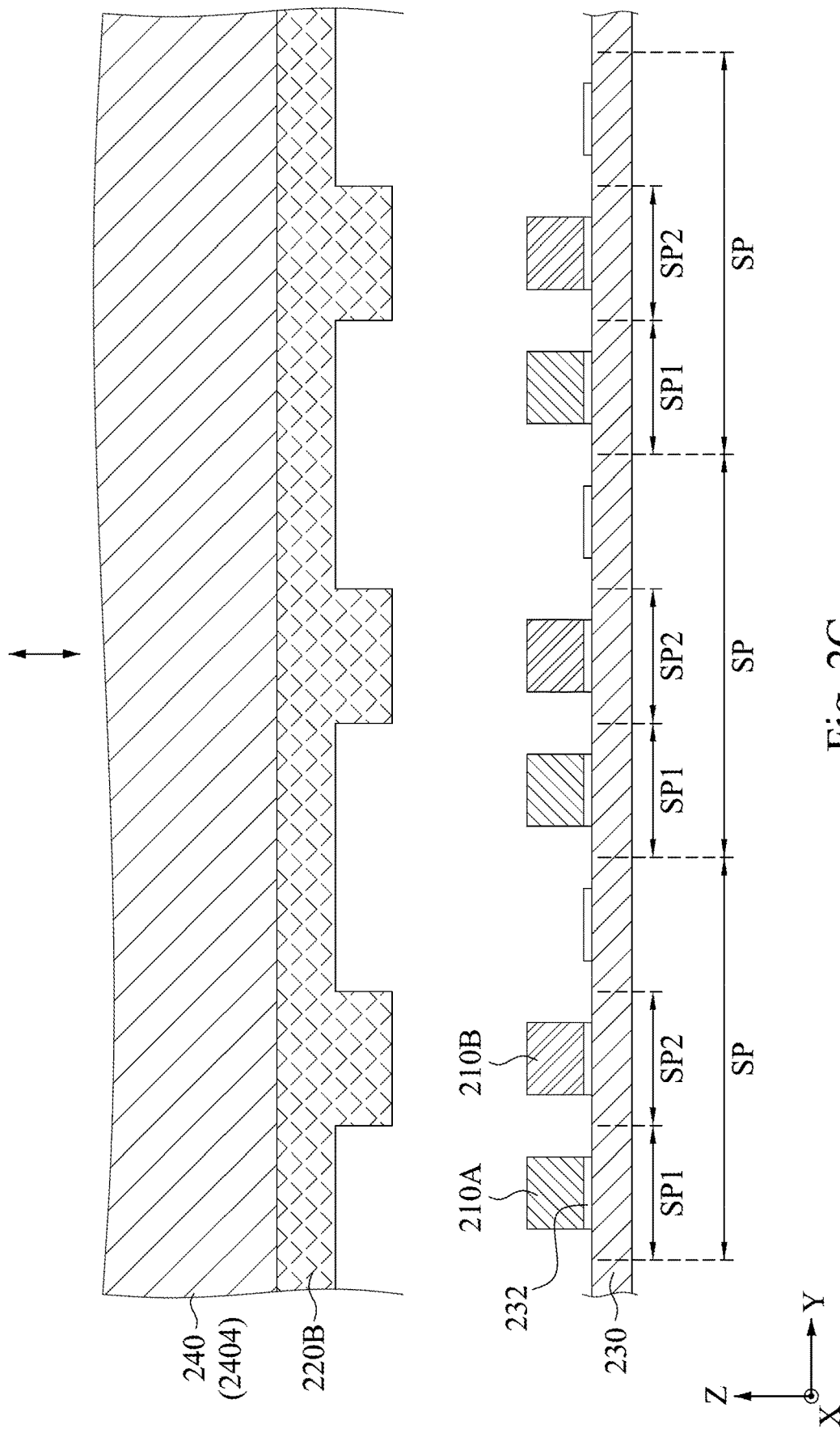
FIG. 2G is a schematic cross-sectional view of an intermediate stage of the method of transferring different types of micro devices according to some embodiments of the present disclosure.

Reference is made to FIGS. 1 to 2G. FIG. 1 is a schematic flow chart of a method 100 of transferring different types of micro devices according to some embodiments of the present disclosure. FIGS. 2A to 2G are schematic cross-sectional views of intermediate stages of the method 100 of transferring different types of micro devices according to some embodiments of the present disclosure. The method 100 begins with operation 110 in which a first detachable transfer plate 220A with first type micro devices 210A thereon is assembled to an alignment assistive mechanism 240 which is substantially above a receiving substrate 230, and the first type micro devices 210A face the receiving substrate 230 (as referred to FIG. 2A). The method 100 continues with operation 120 in which the first type micro devices 210A on the first detachable transfer plate 220A are aligned with positions of first sub-pixels SP1 respectively of pixels SP on the receiving substrate 230 by the alignment assistive mechanism 240. The method 100 continues with operation 130 in which the first type micro devices 210A are transferred to the first sub-pixels SP1 on the receiving substrate 230 (as referred to FIG. 2B). The method 100 continues with operation 140 in which the first detachable transfer plate 220A is replaced with a second detachable transfer plate 220B with second type micro devices 210B thereon, and the second type micro devices 210B face the receiving substrate 230 (as referred to FIGS. 2C and 2D). The method 100 continues with operation 150 in which the second type micro devices 210B are transferred to second sub-pixels SP2 respectively of the pixels SP on the receiving substrate 230 (as referred to FIGS. 2E, 2F, and 2G).

Since only the first detachable transfer plate 220A with the first type micro devices 210A thereon is replaced with the second detachable transfer plate 220B with the second type micro devices 210B thereon during operations of transferring different types of micro devices 210A and 210B (e.g., two sets of micro light-emitting diodes respectively having two different emission wavelengths, but should not be limited thereto) to the same receiving substrate 230, a throughput of transferring the micro devices is enhanced because there is no need to move the alignment assistive mechanism 240 horizontally (in x- and y-direction as shown in figures) by a large distance to pick-up and place different types of micro devices, and the detachable transfer plates 220A and 220B are smaller, lighter, and simpler in structure compared to the alignment assistive mechanism 240. It is noted that normally micro devices of the same type (e.g., the first type micro devices 210A) means the micro devices which come from the same epitaxial layer grown from a growth substrate, and then the growth substrate is removed by, e.g., laser lift-off (LLO), but should not be limited thereto.

Reference is made to FIGS. 2A and 2B. In some embodiments, the alignment assistive mechanism 240 has a first portion 2402 fixed at a place and a second portion 2404 which is movable at least in one axis. Specifically, the alignment assistive mechanism 240 can be set up in a production line. In some embodiments, the first portion 2402 can be fixed on a certain place in the production line, but should not be limited thereto. The second portion 2404 has degrees of freedom in at least z-axis as shown in the figures. The second portion 2404 can have degrees of freedom in x-axis and y-axis for aligning. The first detachable transfer plate 220A can be detachably assembled on the second portion 2404 of the alignment assistive mechanism 240. The first detachable transfer plate 220A is configured to pick up the first type micro devices 210A from a substrate or to place the first type micro devices 210A on the receiving substrate 230.

Reference is made to FIGS. 2C and 2D. To replace the first detachable transfer plate 220A with the second detachable transfer plate 220B, in some embodiments, the first detachable transfer plate 220A is first detached (disassembled) from the alignment assistive mechanism 240 (see FIG. 2C), and then the second detachable transfer plate 220B with the second type micro devices 210B thereon is assembled to the alignment assistive mechanism 240 (see FIG. 2D).

Reference is made to FIGS. 2D to 2F'. In some embodiments, the method 100 further includes aligning the second type micro devices 210B on the second detachable transfer plate 220B with positions of the second sub-pixels SP2 on the receiving substrate 230 by the alignment assistive mechanism 240. Each of the pixels SP includes one first sub-pixel SP1 and one second sub-pixel SP2. In some embodiments, in one of the pixels SP the position of the second sub-pixel SP2 is next to the first sub-pixel SP1 (see FIG. 2E). In some embodiments, in one of the pixels SP the position of the second sub-pixel SP2 is spaced apart from the first sub-pixel SP1 (see FIG. 2E'). As such, the alignment assistive mechanism 240 only needs to be moved by at least one pitch SPP of sub-pixels during operations of transferring the first type micro devices 210A and the second type micro devices 210B to the contact pads 232 of the receiving substrate 230 respectively within the first sub-pixels SP1 and the second sub-pixels SP2, so as to save time for moving and aligning the second detachable transfer plate 220B with the receiving substrate 230. The pitch SPP of sub-pixels is a pitch between one of the first sub-pixels SP1 and one of the second sub-pixels SP2 next to said one of the first sub-pixels SP1 (see FIG. 2E). In some embodiments, the pitch SPP of sub-pixels is less than or equal to 500 μm which supports the saving time for moving and aligning the second detachable transfer plate 220B with the receiving substrate 230 as mentioned (i.e., moving horizontally the alignment assistive mechanism 240 to a certain position) to reach a deviation within 2.5 μm, which fits an accuracy of positions needed in the embodiments of the present disclosure.

Figure 3A:
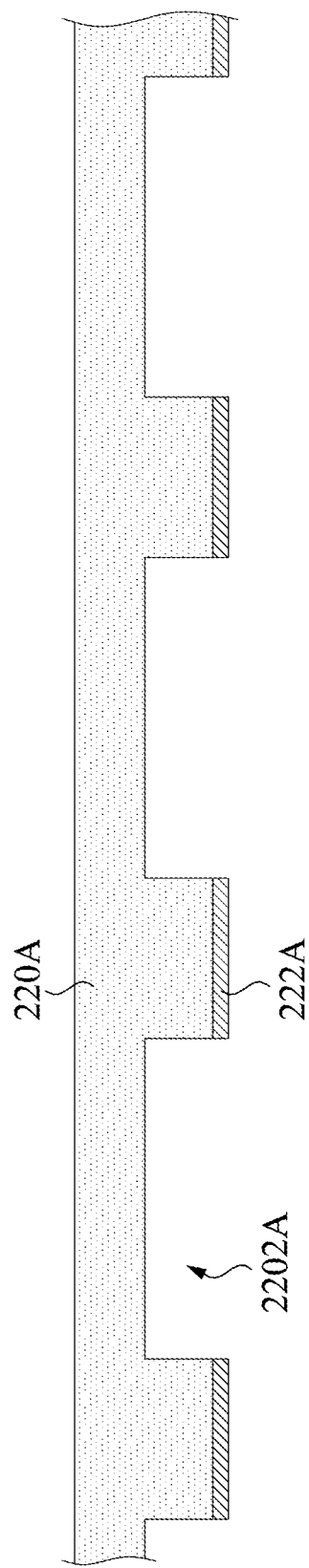
FIG. 3A is a schematic cross-sectional view of a first detachable transfer plate according to some embodiments of the present disclosure.
Figure 3B:
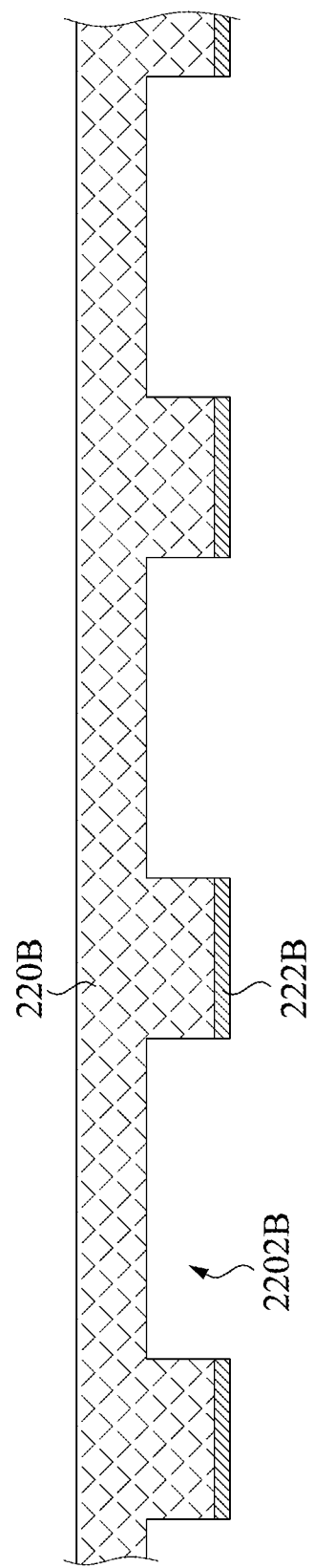
FIG. 3B is a schematic cross-sectional view of a second detachable transfer plate according to some embodiments of the present disclosure.

Reference is made to FIGS. 3A and 3B. FIG. 3A is a schematic cross-sectional view of the first detachable transfer plate 220A according to some embodiments of the present disclosure. FIG. 3B is a schematic cross-sectional view of the second detachable transfer plate 220B according to some embodiments of the present disclosure. In some embodiments, the first detachable transfer plate 220A and the second detachable transfer plate 220B are made of fused silica or glass with glue layers 222A and 222B respectively thereon configured to respectively grip the first type micro devices 210A and the second type micro devices 210B. In some embodiments, the glue layers 222A and 222B are ultraviolet (UV) curable glue layers or UV release layers, but should not be limited thereto. Adhesive forces applied to the first type micro devices 210A and the second type micro devices 210B by the glue layers 222A and 222B can be reduced after the glue layers 222A and 222B are irradiated by UV light. Therefore, in the above embodiments, the first type micro devices 210A are picked up by the first detachable transfer plate 220A through the adhesive force exerted by the glue layers 222A, and/or the second type micro devices 210B are picked up by the second detachable transfer plate 220B through the adhesive force exerted by the glue layers 222B, and then the adhesive force between the first detachable transfer plate 220A and the first type micro devices 210A is reduced before the first type micro devices 210A are transferred to the receiving substrate 230, and/or the adhesive force between the second detachable transfer plate 220B and the second type micro devices 210B is reduced before the second type micro devices 210B are transferred to the receiving substrate 230.

In some embodiments, the first detachable transfer plate 220A includes recess(es) 2202A (see FIG. 3A) and the second detachable transfer plate 220B includes recess(es) 2202B (see FIG. 3B). The recess(es) 2202A and 2202B are configured to accommodate devices not to be picked up or objects which are already existed on the receiving substrate 230.

In some embodiments, the first type micro devices 210A are one type of red light-emitting diodes, green light-emitting diodes, blue light-emitting diodes, yellow light-emitting diodes, cyan light-emitting diodes, and ultraviolet light-emitting diodes, but should not be limited thereto. The second type micro devices 210B are another type of the red light-emitting diodes, the green light-emitting diodes, the blue light-emitting diodes, the yellow light-emitting diodes, the cyan light-emitting diodes, and the ultraviolet light-emitting diodes. Briefly, the second type micro devices 210B are different from the first type micro devices 210A.

Figure 4A:
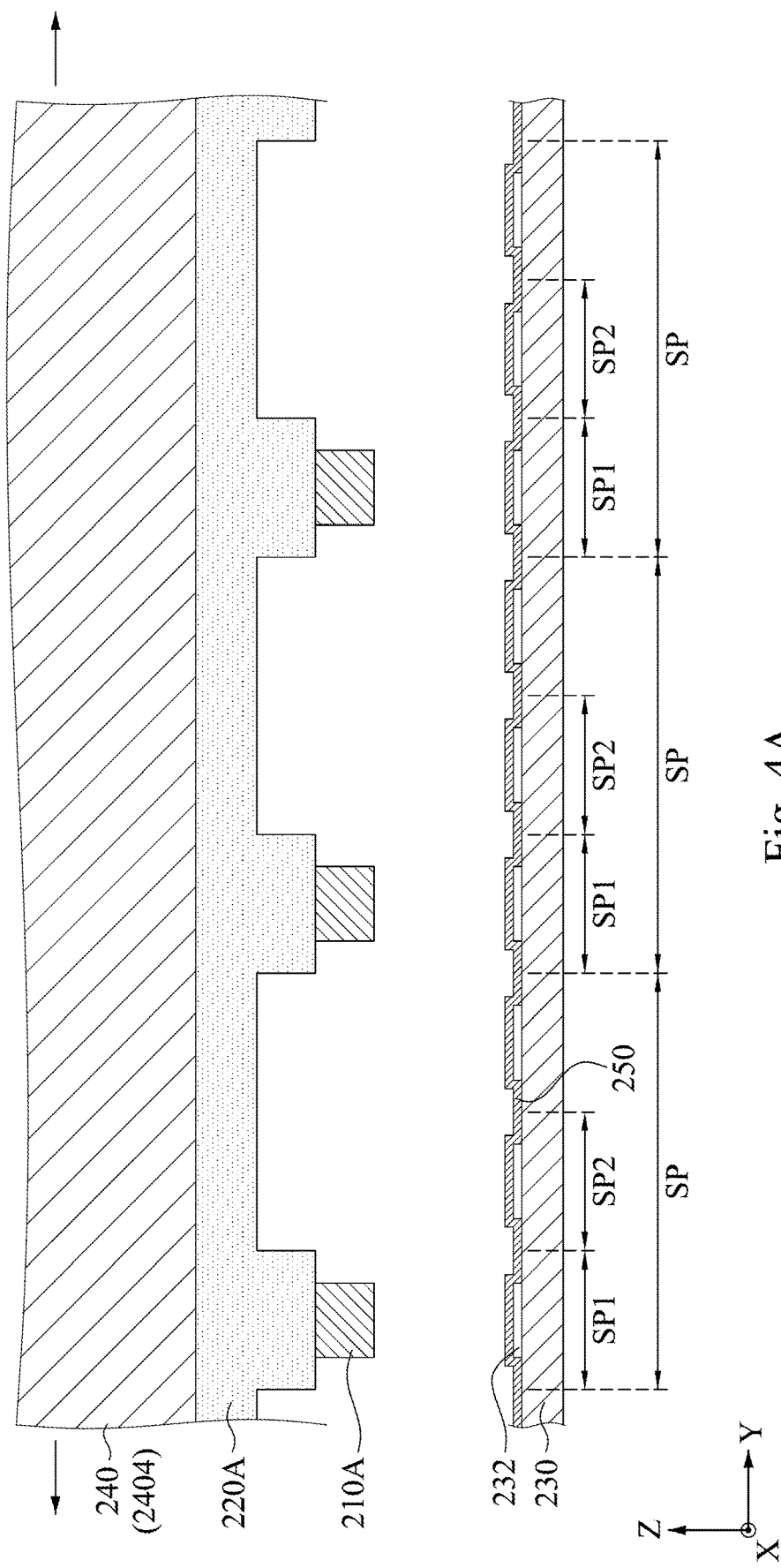
FIG. 4A is a schematic cross-sectional view of an optional stage of the method of transferring different types of micro devices according to some embodiments of the present disclosure.
Figure 4B:
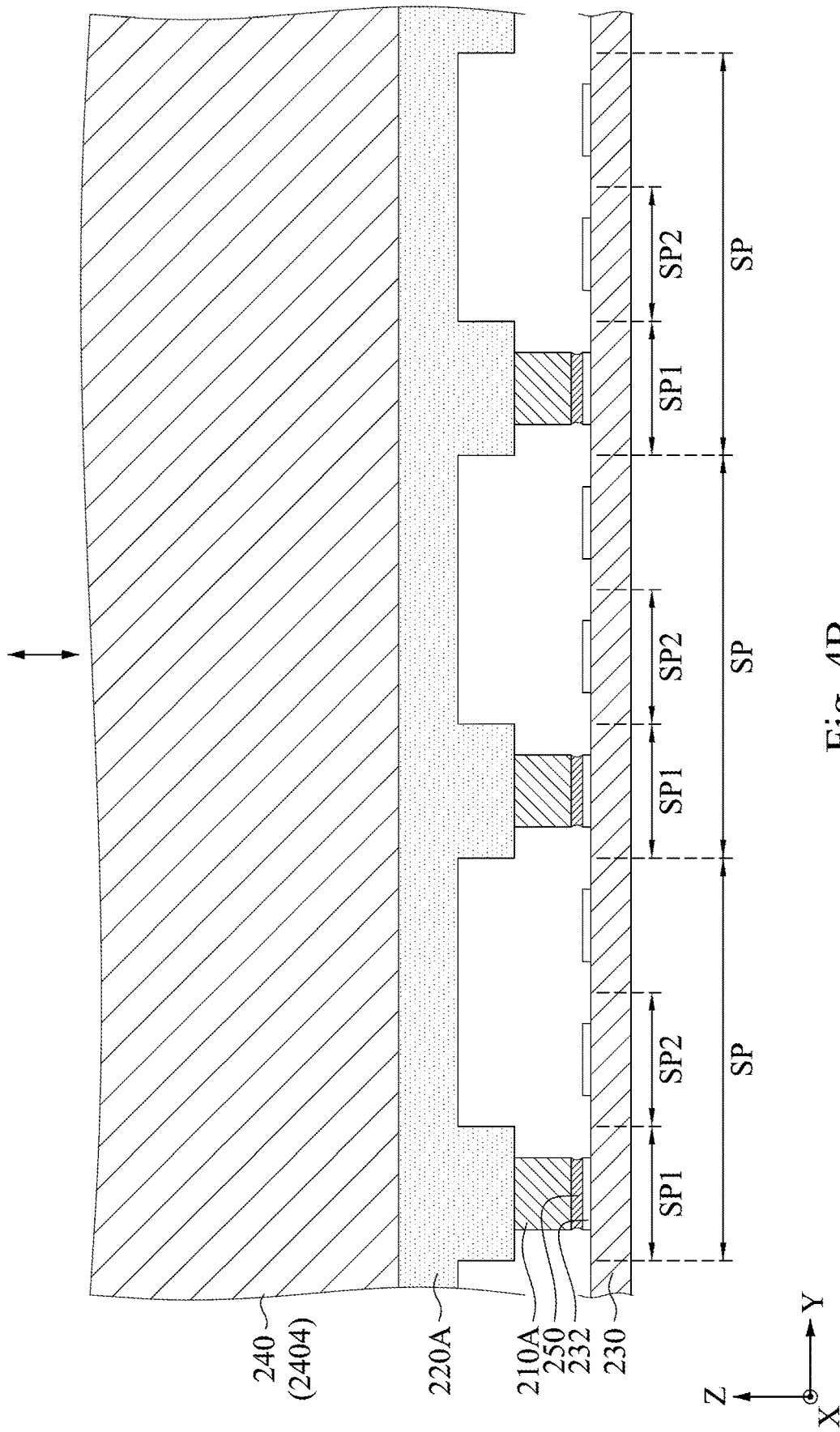
FIG. 4B is a schematic cross-sectional view of an optional stage of the method of transferring different types of micro devices according to some embodiments of the present disclosure.

Reference is made to FIGS. 4A to 4B. FIGS. 4A and 4B are schematic cross-sectional views of optional stages of the method 100 of transferring different types of micro devices according to some embodiments of the present disclosure. In some embodiments, liquid 250 is formed between the first type micro devices 210A and the receiving substrate 230 during transferring the first type micro devices 210A to the receiving substrate 230, such that the first type micro devices 210A and the contact pads 232 on the receiving substrate 230 are gripped together by the capillary force produced by two opposite surfaces of the liquid 250 when the first type micro devices 210A are placed in proximity to the contact pads 232. The liquid 250 can be formed on surfaces of the contact pads 232 facing the first type micro devices 210A or on surfaces of the first type micro devices 210A facing the contact pads 232. The liquid 250 can also be formed on both of the surfaces of the first type micro devices 210A and the surfaces of the contact pads 232 as mentioned. In some embodiments, the capillary force is greater than the adhesive force between the first detachable transfer plate 220A and the first type micro devices 210A before the adhesive force is reduced. In some embodiments, the capillary force is greater than the adhesive force between the first detachable transfer plate 220A and the first type micro devices 210A after the adhesive force is reduced. Under the above condition, the first type micro devices 210A can be released from the first detachable transfer plate 220A before the liquid 250 is evaporated. In some embodiments, a temperature of the receiving substrate 230 is lowered such that the liquid 250 is frozen before the first type micro devices 210A are released from the first detachable transfer plate 220A. Specifically, the frozen liquid 250 provides a force to grip the first type micro devices 210A, and the first type micro devices 210A are then released from the first detachable transfer plate 220A. In some embodiments, the force provided by the frozen liquid 250 is greater than the adhesive force between the first detachable transfer plate 220A and the first type micro devices 210A before the adhesive force is reduced. In some embodiments, the force provided by the frozen liquid 250 is greater than the adhesive force between the first detachable transfer plate 220A and the first type micro devices 210A after the adhesive force is reduced.

Figure 4C:
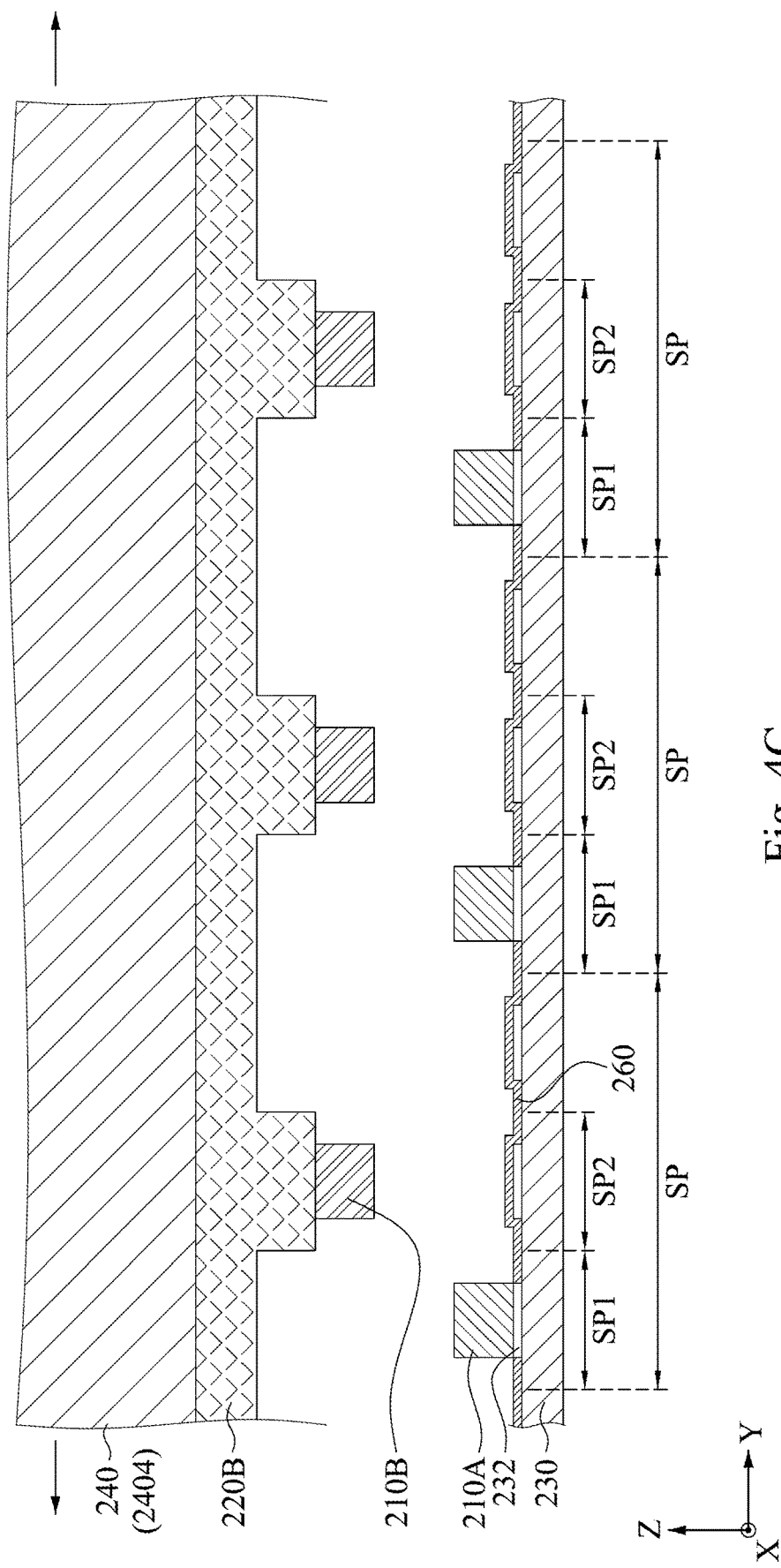
FIG. 4C is a schematic cross-sectional view of an optional stage of the method of transferring different types of micro devices according to some embodiments of the present disclosure.

After the first type micro devices 210A and the contact pads 232 are gripped together by the capillary force, the liquid 250 is evaporated such that at least one of the first type micro devices 210A is stuck and bound to the contact pads 232 of the receiving substrate 230 (see FIG. 4C or back to see FIG. 2C). In some embodiments, a binding force which binds the first type micro devices 210A to the contact pads 232 is greater than the adhesive force between the first detachable transfer plate 220A and the first type micro devices 210A before the adhesive force is reduced. In some embodiments, the binding force which binds the first type micro devices 210A to the contact pads 232 is greater than the adhesive force between the first detachable transfer plate 220A and the first type micro devices 210A after the adhesive force is reduced. Under the above condition, the first type micro devices 210A can be released from the first detachable transfer plate 220A after the liquid 250 is evaporated.

Figure 4D:
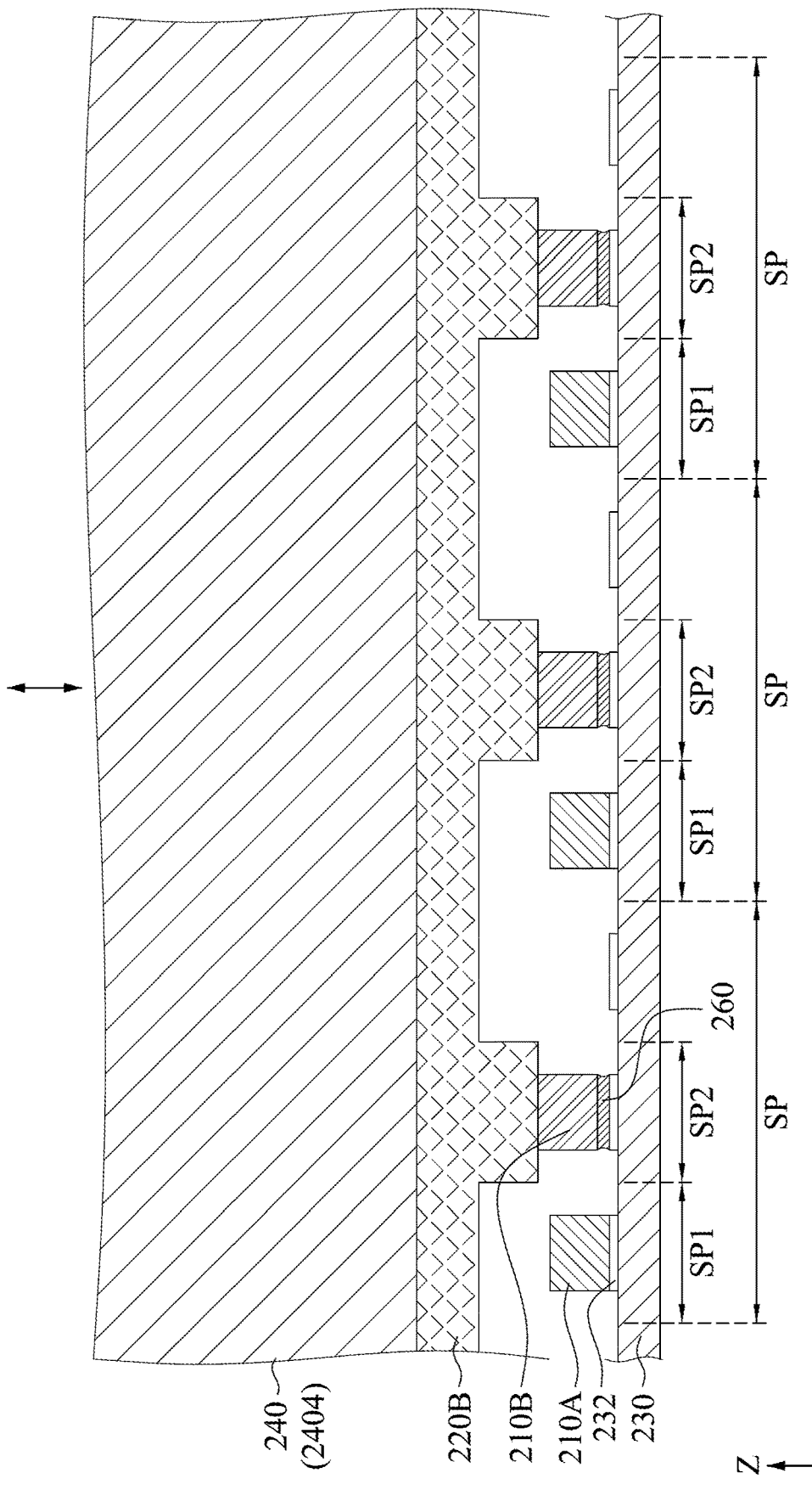
FIG. 4D is a schematic cross-sectional view of an optional stage of the method of transferring different types of micro devices according to some embodiments of the present disclosure.

Reference is made to FIGS. 4C and 4D. FIGS. 4C and 4D are schematic cross-sectional views of optional stages of the method 100 of transferring different types of micro devices according to some embodiments of the present disclosure. In some embodiments, liquid 260 is formed between the second type micro devices 210B and the receiving substrate 230 during transferring the second type micro devices 210B to the receiving substrate 230, such that the second type micro devices 210B and the contact pads 232 on the receiving substrate 230 are gripped together by the capillary force produced by two opposite surfaces of the liquid 260 when the second type micro devices 210B are placed in proximity to the contact pads 232. The liquid 260 can be formed on surfaces of the contact pads 232 facing the second type micro devices 210b or on surfaces of the second type micro devices 210B facing the contact pads 232. The liquid 260 can also be formed on both of the surfaces of the second type micro devices 210B and the surfaces of the contact pads 232 as mentioned. In some embodiments, the capillary force is greater than the adhesive force between the second detachable transfer plate 220B and the second type micro devices 2106 before the adhesive force is reduced. In some embodiments, the capillary force is greater than the adhesive force between the second detachable transfer plate 220B and the second type micro devices 210B after the adhesive force is reduced. Under the above condition, the second type micro devices 210B can be released from the second detachable transfer plate 220B before the liquid 260 is evaporated. In some embodiments, a temperature of the receiving substrate 230 is lowered such that the liquid 260 is frozen before the second type micro devices 210B are released from the second detachable transfer plate 220B. Specifically, the frozen liquid 260 provides a force to grip the second type micro devices 210B, and the second type micro devices 210B are then released from the second detachable transfer plate 220B. In some embodiments, the force provided by the frozen liquid 260 is greater than the adhesive force between the second detachable transfer plate 220B and the second type micro devices 2106 before the adhesive force is reduced. In some embodiments, the force provided by the frozen liquid 260 is greater than the adhesive force between the second detachable transfer plate 220B and the second type micro devices 210B after the adhesive force is reduced.

After the second type micro devices 210B and the contact pads 232 are gripped together by the capillary force, the liquid 260 is evaporated such that at least one of the second type micro devices 210B is stuck and bound to the contact pads 232 of the receiving substrate 230 (back to see FIG. 2G). In some embodiments, a binding force which binds the second type micro devices 210B to the contact pads 232 is greater than the adhesive force between the second detachable transfer plate 220B and the second type micro devices 210B before the adhesive force is reduced. In some embodiments, the binding force which binds the second type micro devices 210B to the contact pads 232 is greater than the adhesive force between the second detachable transfer plate 220B and the second type micro devices 210B after the adhesive force is reduced. Under the above condition, the second type micro devices 210B can be released from the second detachable transfer plate 220B after the liquid 260 is evaporated.

Figure 5A:
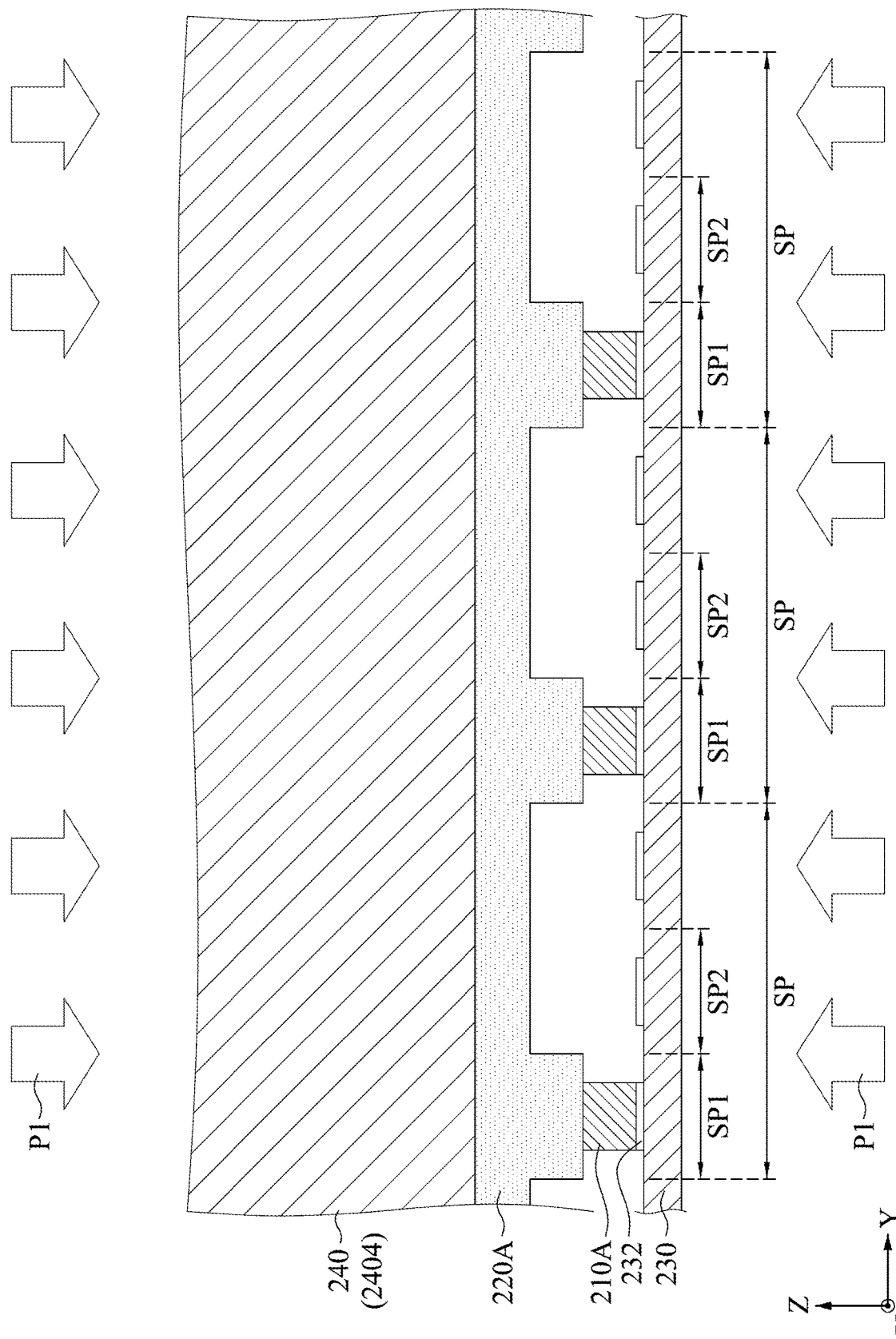
FIG. 5A is a schematic cross-sectional view of an optional stage of the method of transferring the first type micro devices according to some embodiments of the present disclosure.
Figure 5B:
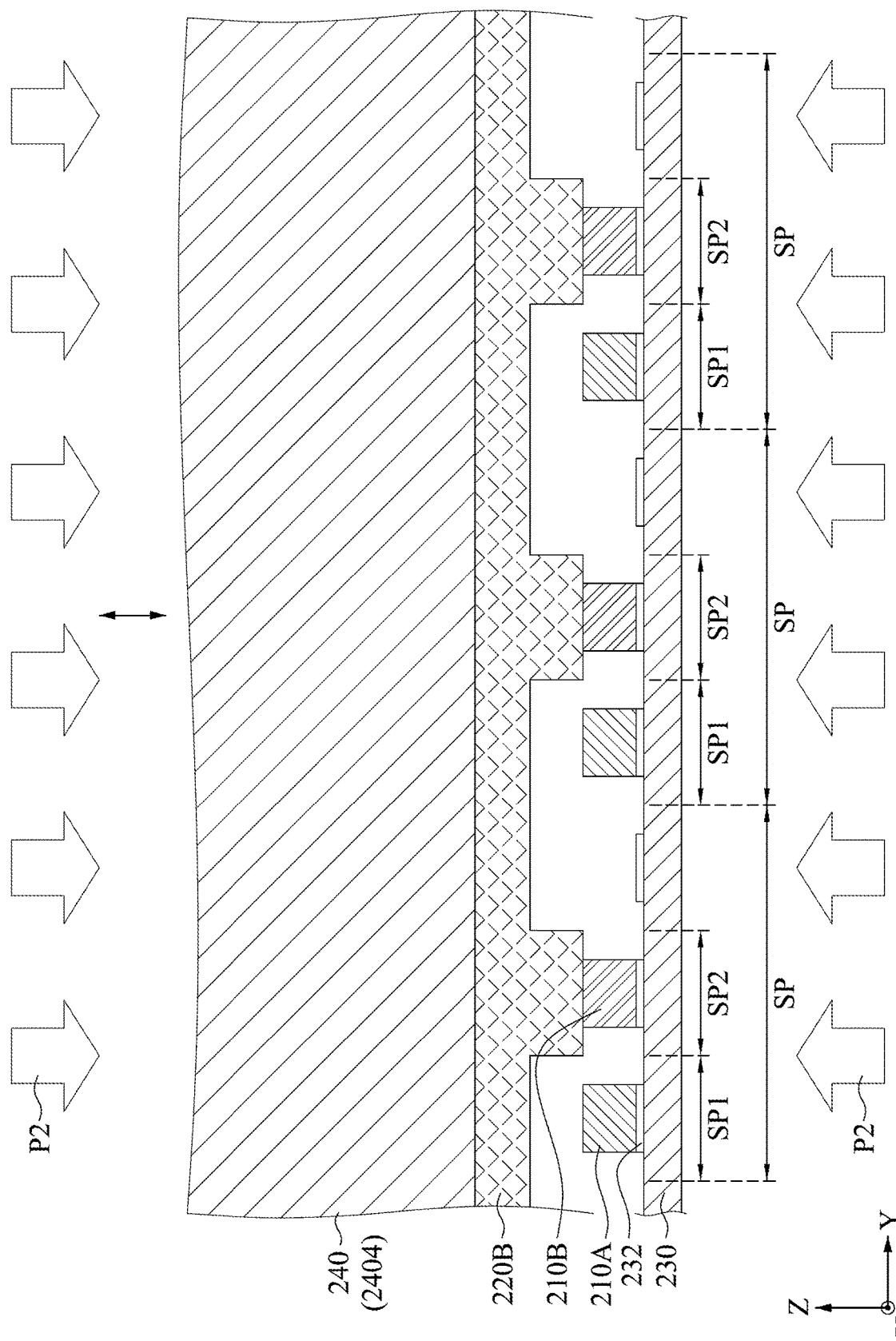
FIG. 5B is a schematic cross-sectional view of an optional stage of the method of transferring the second type micro devices according to some embodiments of the present disclosure.

Reference is made to FIGS. 5A and 5B. FIG. 5A is a schematic cross-sectional view of an optional stage of the method 100 of transferring the first type micro devices 210A according to some embodiments of the present disclosure. In some embodiments, an external pressure P1 is applied to press the first type micro devices 210A and the receiving substrate 230 during evaporating the liquid 250 to further assist contacting the first type micro devices 210A to the contact pads 232 such that a better solid phase bonding therebetween can occur. The external pressure P1 can be applied by the alignment assistive mechanism 240 to the first type micro devices 210A or changing the environmental pressure to press the first type micro devices 210A and the contact pads 232, but should not be limited thereto. FIG. 5B is a schematic cross-sectional view of an optional stage of the method 100 of transferring the second type micro devices 210B according to some embodiments of the present disclosure. In some embodiments, an external pressure P2 is applied to press the second type micro devices 210B and the receiving substrate 230 during evaporating the liquid 260 to further assist contacting the second type micro devices 210B to the contact pads 232 such that a better solid phase diffusion bonding therebetween can occur. Other details of applying the external pressure P2 are similar to the embodiments of applying the external pressure P1 and will not be repeated again.

It is noted that in the above embodiments a number of the detachable transfer plates (e.g., the first detachable transfer plates 220A, the second detachable transfer plates 220B . . . etc.,) can be more than two. For example, when there are three or more types of micro devices (e.g., the red micro light-emitting diodes, green micro light-emitting diodes, and blue micro light-emitting diodes . . . etc.,), there can be corresponding three or more detachable transfer plates, so as to enhance the throughput of transferring different types of micro devices.

In summary, embodiments of the present disclosure provide a method of transferring different types of micro devices in which only a detachable transfer plate with one type of micro devices thereon is replaced with another detachable transfer plate with another type of micro devices thereon during operations of transferring different types of micro devices to a receiving substrate. There is no need to move an alignment assistive mechanism horizontally by a large distance to pick-up and place different types of micro devices. As such, a throughput of transferring micro devices is enhanced, and time for alignment is reduced.

Although the present disclosure has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the method and the structure of the present disclosure without departing from the scope or spirit of the disclosure. In view of the foregoing, it is intended that the present disclosure cover modifications and variations of this disclosure provided they fall within the scope of the following claims.

What is claimed is:

1. A method of transferring different types of micro devices, comprising:

assembling a first detachable transfer plate with first type micro devices thereon to an alignment assistive mechanism which is substantially above a receiving substrate, wherein the first type micro devices face the receiving substrate;

aligning the first type micro devices on the first detachable transfer plate with positions of first sub-pixels respectively of pixels on the receiving substrate by the alignment assistive mechanism;

transferring the first type micro devices to the first sub-pixels on the receiving substrate;

replacing the first detachable transfer plate with a second detachable transfer plate with second type micro devices thereon by first detaching the first detachable transfer plate from the alignment assistive mechanism, and then assembling the second detachable transfer plate to the alignment assistive mechanism, wherein the second type micro devices face the receiving substrate; and transferring the second type micro devices to second sub-pixels respectively of the pixels on the receiving substrate.

2. The method of claim 1, further comprising:

aligning the second type micro devices on the second detachable transfer plate with positions of the second sub-pixels by the alignment assistive mechanism.

3. The method of claim 2, wherein the positions of the second sub-pixels are respectively next to the first sub-pixels on the receiving substrate.

4. The method of claim 3, wherein aligning the second type micro devices is performed by moving the alignment assistive mechanism by a pitch of sub-pixels, wherein the pitch of sub-pixels is a pitch between one of the first sub-pixels and one of the second sub-pixels next to said one of the first sub-pixels.

5. The method of claim 4, wherein the pitch of sub-pixels is less than or equal to 500 μm.

6. The method of claim 2, wherein the positions of the second sub-pixels are respectively spaced apart from the first sub-pixels.

7. The method of claim 1, wherein the first detachable transfer plate and the second detachable transfer plate are made of fused silica or glass with a glue layer thereon configured to grip the first type micro devices and the second type micro devices.

8. The method of claim 1, wherein the first type micro devices are picked up by the first detachable transfer plate through an adhesive force exerted by the first detachable transfer plate, and/or the second type micro devices are picked up by the second detachable transfer plate through an adhesive force exerted by the second detachable transfer plate.

9. The method of claim 1, wherein the first type micro devices are one type of red light-emitting diodes, green light-emitting diodes, blue light-emitting diodes, yellow light-emitting diodes, cyan light-emitting diodes, and ultraviolet light-emitting diodes.

10. The method of claim 9, wherein the second type micro devices are another type of red light-emitting diodes, green light-emitting diodes, blue light-emitting diodes, yellow light-emitting diodes, cyan light-emitting diodes, and ultraviolet light-emitting diodes.

11. The method of claim 1, further comprising:
reducing an adhesive force between the first detachable transfer plate and the first type micro devices before transferring the first type micro devices to the receiving substrate, and/or reducing an adhesive force between the second detachable transfer plate and the second type micro devices before transferring the second type micro devices to the receiving substrate.

12. The method of claim 11, further comprising:
forming liquid between the first type micro devices and the receiving substrate during transferring the first type micro devices to the receiving substrate, such that at least one of the first type micro devices is gripped by a capillary force produced by the liquid.

13. The method of claim 12, further comprising:
evaporating the liquid such that at least one of the first type micro devices is stuck and bound to the receiving substrate.

14. The method of claim 13, further comprising:
applying an external pressure to press the first type micro devices and the receiving substrate during evaporating the liquid.

15. The method of claim 12, further comprising:
lowering a temperature of the receiving substrate such that the liquid is frozen.

16. The method of claim 1, further comprising:
forming another liquid between the second type micro devices and the receiving substrate during transferring the second type micro devices to the receiving substrate, such that at least one of the second type micro devices is gripped by a capillary force produced by the another liquid.

17. The method of claim 16, further comprising:
evaporating the another liquid such that at least one of the second type micro devices is stuck and bound to the receiving substrate.

18. The method of claim 17, further comprising:
applying an external pressure to press the second type micro devices and the receiving substrate during evaporating the another liquid.

19. The method of claim 16, further comprising:
lowering a temperature of the receiving substrate such that the another liquid is frozen.

* * * * *